US008199308B2

(12) United States Patent
Chang et al.

(10) Patent No.: US 8,199,308 B2
(45) Date of Patent: Jun. 12, 2012

(54) LIQUID CRYSTAL DISPLAY HAVING A CHIP ON FILM STRUCTURE WITH A PLURALITY OF INPUT PADS COMPRISING A THIN EXTENDING PORTION THAT EXTENDS TO A CUTTING EDGE

(75) Inventors: Ke-Chih Chang, Hsin-Chu (TW);
Chih-Hsiang Yang, Hsin-Chu (TW);
Sheng-Kai Hsu, Hsin-Chu (TW);
Yi-Chih Huang, Hsin-Chu (TW);
Ying-Chao Chen, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 371 days.

(21) Appl. No.: 12/222,354

(22) Filed: Aug. 7, 2008

(65) Prior Publication Data

US 2009/0153791 A1 Jun. 18, 2009

(30) Foreign Application Priority Data

Dec. 12, 2007 (TW) ................................. 96147529 A

(51) Int. Cl.
*G02F 1/1345* (2006.01)
(52) U.S. Cl. ........................ 349/151; 349/150; 349/152
(58) Field of Classification Search .................. 349/149, 349/150, 151, 152
See application file for complete search history.

(56) References Cited

U.S. PATENT DOCUMENTS

| 6,300,997 | B1* | 10/2001 | Saito et al. ..................... 349/149 |
| 6,495,768 | B1 | 12/2002 | Cho et al. |
| 7,019,393 | B2 | 3/2006 | Toriyama |
| 2005/0243267 | A1 | 11/2005 | Jeoung et al. |
| 2006/0152662 | A1* | 7/2006 | Ko et al. ........................ 349/149 |
| 2006/0267971 | A1* | 11/2006 | Yoo ............................... 345/206 |

FOREIGN PATENT DOCUMENTS

| TW | 548482 B | 8/2003 |
| TW | I243438 | 11/2005 |
| TW | 200610969 | 4/2006 |
| TW | 255021 B | 5/2006 |

\* cited by examiner

*Primary Examiner* — Mark Robinson
*Assistant Examiner* — Paul Lee
(74) *Attorney, Agent, or Firm* — Rabin & Berdo, PC

(57) ABSTRACT

The chip on film structure for a liquid crystal display is disclosed. The chip on film structure includes a film substrate, a driver chip disposed on the film substrate, a plurality of the input pad, and a plurality of output pads. The input pads and the output pads are disposed on two opposite sides of the driver chip, and are electrically connect to the driver chip respectively. Each input pad comprises an extending portion extending from the input pads to a first cutting edge respectively, and a width of the extending portion is thinner than a width of the input pad, and the extending portions are cut along the first cutting edge.

12 Claims, 4 Drawing Sheets

LIQUID CRYSTAL DISPLAY HAVING A CHIP ON FILM STRUCTURE WITH A PLURALITY OF INPUT PADS COMPRISING A THIN EXTENDING PORTION THAT EXTENDS TO A CUTTING EDGE

RELATED APPLICATIONS

This application claims priority to Taiwan Application Serial Number 96147529, filed Dec. 12, 2007, which is herein incorporated by reference.

BACKGROUND

1. Field of Invention

The present invention relates to a chip on film structure. More particularly, the present invention relates to a chip on film structure for a liquid crystal display.

2. Description of Related Art

Recently, liquid crystal displays (LCD) have been widely applied in electrical products, due to the rapid progress of optical technology and semiconductor technology. Moreover, with the advantages of high image quality, compact size, light weight, low driving voltage, and low power consumption, LCDs have been introduced into portable computers, personal digital assistants, color televisions, and are gradually replacing the cathode ray tubes (CRT) used in conventional displays. LCDs have become the mainstream display apparatus.

Conventional display panels have two types of tape carrier packages (TCPs). Each TCP type contains only data driver chips or scan driver chips, which are respectively connected to the data lines or the scan lines to drive the pixels of the display panel. Display panel demand and cost concerns have created a tendency to omit the additional tape carrier packages, for example, by directly bonding driver chips on the glass substrate (COG) or bonding driver chips on the film substrate (COF).

The chip on film technique may simplify the manufacturing process, save the prime cost, reduce the package volume, and the product made by the COF technique may become popular. However, input pads and the output pads of the chip on film structure packaged with the driver chip may be cut when the chip on film structure is punched from the tape, and the metal particles may be generated. The metal particles generated from the punching process may be dispersed onto the chip circuit and the metal particles may then short circuit the circuit on the chip on film structure, thus the reliability of the chip on film structure is reduced.

U.S. Pat. No. 6,495,768 has disclosed a tape carrier package (TCP) structure. The input pads of the TCP structure are arranged inner than the cutting edge of the film substrate, and the extending portions of the output pads extending through the cutting edge may have a thinner width. However, the output pads in the prior art would further have a testing area disposed outer the cutting edge, thus the arrangement and the prime cost of the chip on film structure have become a consideration.

SUMMARY

The embodiments of the invention provide a chip on film structure for a liquid crystal display. The chip on film structure includes a film substrate, a driver chip disposed on the film substrate, a plurality of input pads, and a plurality of output pads. The input pads and the output pads are disposed on two opposite sides of the driver chip, and are electrically connected to the driver chip respectively. Each input pad comprises an extending portion extending from the input pads to a first cutting edge respectively, and a width of the extending portion is thinner than the input pad, and the extending portions are cut along the first cutting edge.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
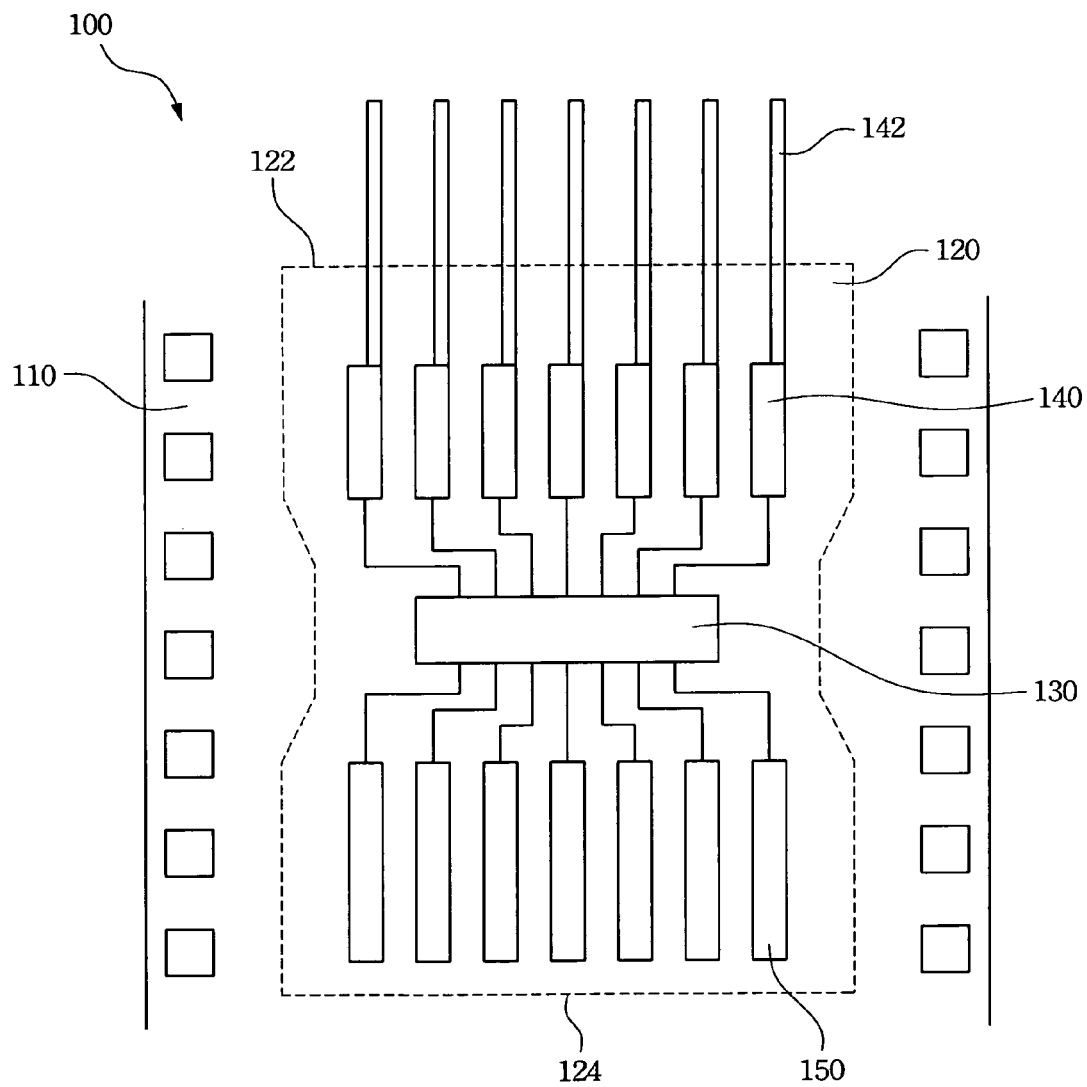
FIG. 1 is a schematic diagram of an embodiment of the chip on film structure of the invention.

Reference will now be made in detail to the present preferred embodiments of the invention, examples of which are illustrated in the accompanying drawings. Wherever possible, the same reference numbers are used in the drawings and the description to refer to the same or like parts.

Refer to FIG. 1. FIG. 1 illustrates a schematic diagram of the chip on film (COF) structure of the invention. The chip on film structure 100 may be utilized in a liquid crystal display. The chip on film structure 100 includes a film substrate 120, a driver chip 130 disposed on the film substrate 120, a plurality of input pads 140, and a plurality of output pads 150. The driver chip 130 is electrically connected to both the input pads 140 and the output pads 150. The input pads 140 are electrically connect to a printed circuit board (not shown), which provides a signal source, and the output pads 150 are electrically connected to a glass panel (not shown). The image signal generated from the printed circuit board (not shown) is transmitted to the driver chip 130 via the input pads 140, and the image signal is further transmitted to the glass panel via the output pads 150 to be displayed.

The film substrate 120 may include a first cutting edge 122 and a second cutting edge 124. The first cutting edge 122 is opposite to the second cutting edge 124. The input pads 140 are disposed between the driver chip 130 and the first cutting edge 122, and the output pads 150 are disposed between the driver chip 130 and the second cutting edge 124. Each input pad 140 may include an extending portion 142 extending from an end opposite the driver chip 130 of the input pads 140 toward the first cutting edge 122. The width of the extending portion 142 may be as thin as possible. The preferred width of the extending portion 142 is smaller than the width of the input pad 140 to reduce the metal particles splashing when the chip on film structure 100 is punched.

The first extending portions 142 may extend through the first cutting edge 122, and a part of the extending portions 142 with smaller width and extending exceed the first cutting edge are cut when the chip on film structure 100 is punched along the first cutting edge 122. There is a distance between the output pads 150 and the second cutting edge 124. The output pads 150 are disposed between the driver chip 130 and the second cutting edge 124, and the output pads 150 are not in contact with the second cutting edge 124. The output pads 150 would not be cut when the chip on film structure 100 is punched along the second cutting edge 124.

To smoothly assemble the liquid crystal display, the chip on film structure 100 may further include a tape 110, and the film substrate 120 is disposed on the tape 110. The tape 110 is rolled into a predetermined position, and the film substrate 120 with the driver chip 130 is punched from the tape 110 along the first cutting edge 122 and the second cutting edge 124 to get the chip on film structure 100 with the driver chip 130. Then, the input pads 140 are bonded to the printed circuit board, and the output pads 150 are connected to the glass panel.

The position of the output pads 150 of the embodiment is shifted inward and is disposed between the second cutting edge 124 and the driver chip 130. Thus the output pads 150 would not be damaged and the metal particles would not be generated when the chip on film structure 100 is punched along the second cutting edge 124 from the tape 110. The width of the extending portions 142, which extends through the first cutting edge 122, is smaller than the width of the input pads 140. The extending portions 142 with smaller width is cut when the chip on film structure 100 is punched along the first cutting edge 122 from the tape 110, and the narrower extending portions 142 reduces the number of dispersed metal.

In a conventional chip on film process, the bonding pads on the film substrate may have a testing area and a bonding area. The surfaces of the testing area and the bonding area may be covered with a tin layer. The testing area is utilized for testing the reliability of the electrical connection, and the bonding area is used for bonding. The chip on film structure 100 of the invention may take the input pads 140 and the output pads 150 as the testing area, and the layout of the conventional testing area may be reduced to shift the output pads 150 to the inside of the second cutting edge 124.

Figure 2:
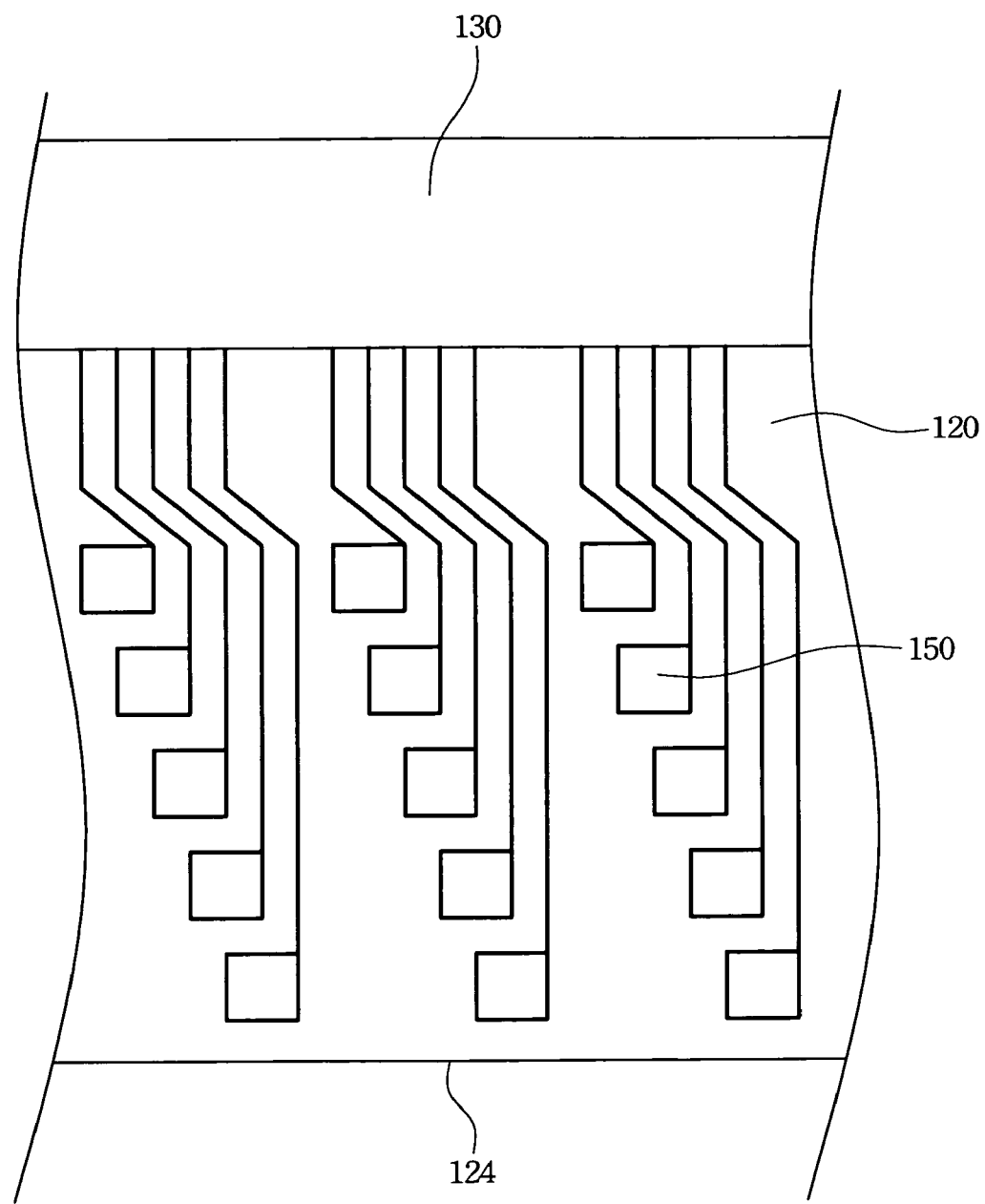
FIG. 2 is a schematic diagram of an embodiment of the output pads of the chip on film structure of the invention.
Figure 3:
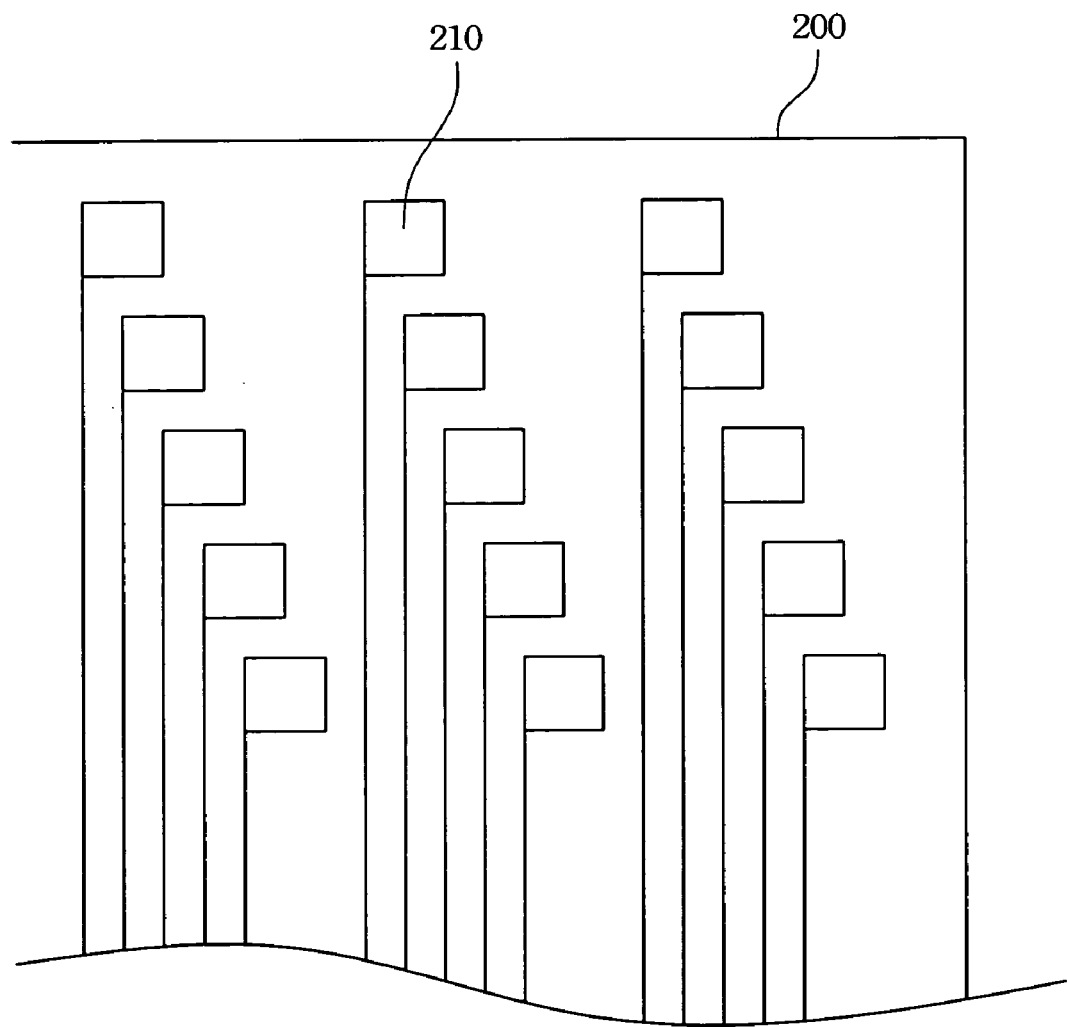
FIG. 3 is a schematic diagram of an embodiment of a part of the glass panel connecting with the chip on film structure of the invention.
Figure 4:
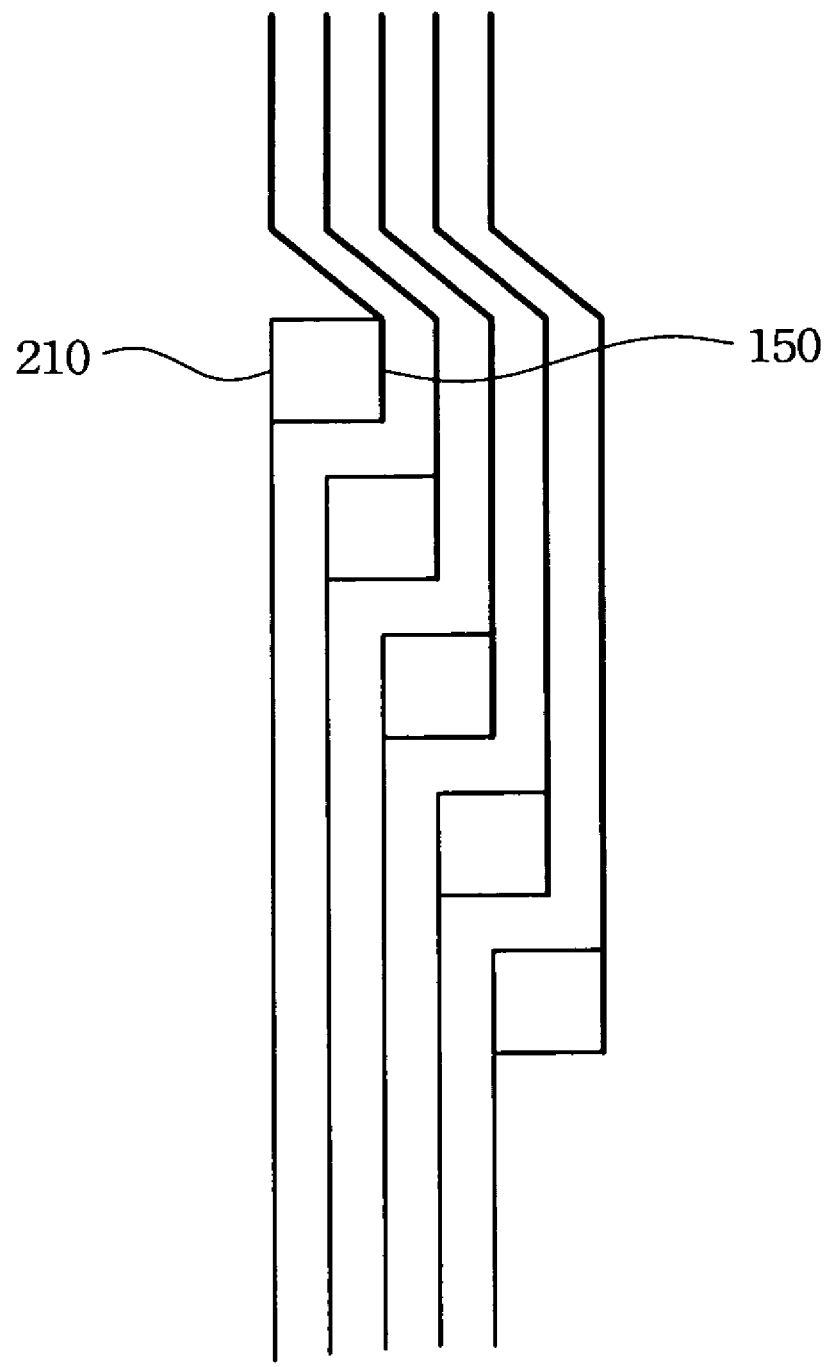
FIG. 4 is a schematic diagram of the embodiment of the output pads connecting to the signal pads of the invention.

Refer to FIG. 2 to FIG. 4 simultaneously. FIG. 2 is a schematic diagram of an embodiment of the output pads of the chip on film structure of the invention. FIG. 3 is a schematic diagram of an embodiment of a part of the glass panel connected to the chip on film structure of the invention. FIG. 4 is a schematic diagram of the embodiment of the output pads connecting to the signal pads of the invention. The output pads 150 on the film substrate 120 are disposed between the second edge 124 and the driver chip 130. The output pads 150 may be regarded as the testing area for testing the reliability of the electrically connecting of the driver chip 130 and the output pads 150 when the chip on film structure 100 is tested. The glass panel 200 in FIG. 3 has a plurality of signal pads 210, and the output pads 150 passed the test may further be regarded as the bonding area to connect to the signal pads 210 of the glass panel 200. The layout of the output pads 150 is according to the layout of the signal pads 210 of the glass panel 200, thus the output pads 150 may couple to the signal pads 210. The bonding schematic diagram of the output pads 150 and the signal pads 210 is shown in FIG. 4.

The shape of the output pads 150 and the signal pads 210 may be a square, and size of the output pads 150 may be equal to the size of the signal pads 210. The leading lines of the output pads 150 and the signal pads 210 are disposed on two opposite sides respectively to prevent the leading lines of the signal pads 210 passing through the output pads 150. The output pads 150 and the signal pads 210 may be arranged in pairs and disposed slantwise in this embodiment.

The output pads 150 may couple with the signal pads 210 by an anisotropic conductive film (ACF). The anisotropic conductive film is disposed between the output pads 150 and the signal pads 210, and then a pre-bonding process is applied to bond the output pads 150 and the signal pads 210 temporarily. Then a main-bonding process is applied to combine the output pads 150 and the signal pads 210, and the anisotropic conductive film is conductive along the thickness direction. Namely, the output pads 150 and the signal pads 210 are connected and conducted by the anisotropic conductive film.

The chip on film structure of the invention may omit the conventional layout of the testing area, thus the space and the material of the chip on film structure may be saved. The output pads may not be damaged when the chip on film structure is punched from the tape along the second cutting edge. The thinner extending portions extending from the input pads are cut when the chip on film structure is punched from the tape. Thus the number of dispersed metal particles may be reduced by cutting through the thinner extending portions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip on film structure for connecting a printed circuit board and a liquid crystal display, the chip on film structure comprising:
   a film substrate having a first cutting edge and a second cutting edge opposite to the first cutting edge;
   a driver chip disposed on the film substrate;
   a plurality of input pads disposed on the film substrate and disposed between the driver chip and the printed circuit board for transmitting a first signal generated from the printed circuit board to the driver chip, each input pad comprising an extending portion extending from the input pads to the first cutting edge respectively, a width of each extending portion being thinner than a width of each input pad, the first cutting edge being cut through the extending portions with thinner width; and
   a plurality of output pads disposed on the film substrate and disposed between the driver chip and the liquid crystal display for transmitting a second signal generated from the driver chip to the liquid crystal display, the output pads being disposed between the driver chip and the second cutting edge and being not in contact with the second cutting edge, the second cutting edge only being cut through the film substrate.

2. The chip on film structure of claim 1, wherein each output pad comprises a test area.

3. The chip on film structure of claim 1, further comprising an anisotropic conductive film (ACF) disposed between the output pads and the glass panel for connecting the output pads and the liquid crystal display.

4. The chip on film structure of claim 1, wherein the extending portions are bonded on the printed circuit board.

5. The chip on film structure of claim 1, wherein the second cutting line does not cut through the output pad.

6. A chip on film structure for connecting a printed circuit board and a liquid crystal display, the chip on film structure comprising:

a film substrate having a first cutting edge and a second cutting edge opposite to the first cutting edge;

a driver chip disposed on the film substrate;

a plurality of input pads disposed on the film substrate and disposed between the driver chip and the printed circuit board for transmitting a first signal generated from the printed circuit board to the driver chip, each input pad comprising an extending portion extending from the input pads to the first cutting edge respectively, a width of each extending portion being thinner than a width of each input pad, the first cutting edge being cut through the extending portions with thinner width;

a plurality of input leads connecting the input pads to the driver chip;

a plurality of output pads disposed on the film substrate and disposed between the driver chip and the liquid crystal display for transmitting a second signal generated from the driver chip to the liquid crystal display, the output pads being disposed between the driver chip and the second cutting edge and being not in contact with the second cutting edge; and a plurality of output leads connecting the output pads and the driver chip, the output leads not touching the second cutting edge.

7. The chip on film structure of claim 6, wherein each output pad comprises a test area.

8. The chip on film structure of claim 6, further comprising an anisotropic conductive film (ACF) disposed between the output pads and the glass panel for connecting the output pads and the liquid crystal display.

9. The chip on film structure of claim 6, wherein the extending portions are bonded on the printed circuit board.

10. The chip on film structure of claim 6, wherein the input leads only arranged between the driver chip and the input pads.

11. The chip on film structure of claim 6, wherein the output leads only arranged between the driver chip and the output pads.

12. The chip on film structure of claim 6, wherein the second cutting line does not cut through the output pad or the output leads.

* * * * *